United States Patent
Tertinek et al.

(10) Patent No.: US 9,548,750 B2
(45) Date of Patent: Jan. 17, 2017

(54) CIRCUIT, A TIME-TO-DIGITAL CONVERTER, AN INTEGRATED CIRCUIT, A TRANSMITTER, A RECEIVER AND A TRANSCEIVER

(71) Applicant: Intel IP Corporation, Santa Clara, CA (US)

(72) Inventors: Stefan Tertinek, Linz (AT); Andreas Leistner, Grasbrunn (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/686,248

(22) Filed: Apr. 14, 2015

(65) Prior Publication Data
US 2015/0372690 A1 Dec. 24, 2015

(30) Foreign Application Priority Data
Jun. 23, 2014 (DE) .......................... 10 2014 108 762

(51) Int. Cl.
*H03L 7/06* (2006.01)
*H03L 7/197* (2006.01)
*H03L 7/085* (2006.01)

(52) U.S. Cl.
CPC ............. *H03L 7/1976* (2013.01); *H03L 7/085* (2013.01)

(58) Field of Classification Search
USPC .............. 327/2–12, 105–123, 141, 144–163; 331/15–17; 375/373–376
See application file for complete search history.

(56) References Cited

U.S. PATENT DOCUMENTS

| | | | | |
|---|---|---|---|---|
| 7,888,973 | B1 * | 2/2011 | Rezzi ..................... | H03L 7/085 327/105 |
| 8,773,182 | B1 * | 7/2014 | Degani ................... | H03L 7/085 327/147 |
| 8,884,672 | B2 * | 11/2014 | Ballantyne ............. | H03L 7/089 327/157 |
| 2009/0231050 | A1 * | 9/2009 | Lin ....................... | H03L 7/1976 331/1 A |
| 2010/0237958 | A1 * | 9/2010 | Goel .................... | H03F 3/45188 331/135 |
| 2010/0310031 | A1 * | 12/2010 | Ballantyne ............... | H03L 7/08 375/376 |
| 2011/0169578 | A1 | 7/2011 | Lucas et al. | |
| 2011/0248753 | A1 | 10/2011 | Leistner | |
| 2012/0176169 | A1 * | 7/2012 | Sinha .................... | H03L 7/1075 327/156 |
| 2013/0002317 | A1 * | 1/2013 | Frantzeskakis ........... | H03L 7/08 327/156 |

(Continued)

Primary Examiner — Brandon S Cole
(74) Attorney, Agent, or Firm — Eschweiler & Associates, LLC

(57) ABSTRACT

A circuit according to an example includes a controllable oscillator configured to generate an output signal based on a control signal, an input signal processing circuit configured to receive a reference signal and configured to generate a sequence of digital values indicative of a phase relation between the reference signal and the output signal or a signal derived from the output signal, and a digital data processing circuit configured to generate a sequence of processed values at a lower frequency than a frequency of the sequence of the digital values, each processed value being based on a plurality of the digital values of the sequence of digital values, wherein the control signal is based on the sequence of processed values.

21 Claims, 8 Drawing Sheets

(56) References Cited

U.S. PATENT DOCUMENTS

| | | | | |
|---|---|---|---|---|
| 2013/0113528 A1* | 5/2013 | Frantzeskakis | ............ | H03L 7/10 |
| | | | | 327/117 |
| 2013/0257494 A1* | 10/2013 | Nikaeen | ................ | H03M 3/458 |
| | | | | 327/156 |
| 2013/0285722 A1* | 10/2013 | Chou | .................... | H03L 7/0898 |
| | | | | 327/157 |
| 2015/0116018 A1* | 4/2015 | Chen | ........................ | H03L 7/091 |
| | | | | 327/159 |
| 2015/0145571 A1* | 5/2015 | Perrott | .................... | H03L 7/093 |
| | | | | 327/159 |

* cited by examiner

CIRCUIT, A TIME-TO-DIGITAL CONVERTER, AN INTEGRATED CIRCUIT, A TRANSMITTER, A RECEIVER AND A TRANSCEIVER

CROSS REFERENCE TO RELATED APPLICATIONS

This application claims priority to German Application number 10 2014 108762.3 filed on Jun. 23, 2014.

FIELD

The present disclosure relates to a time-to-digital converter, a circuit, an integrated circuit, a transmitter, a receiver and a transceiver along with different methods and further implementations.

BACKGROUND

In many transmitter, receiver or transceiver applications, a local oscillator (LO) signal is used, for instance, for up-mixing or down-mixing a signal to be transmitted or received, respectively. Frequency synthesizers based on digital phase-locked loops (DPLLs) have become an important solution, for instance because of their flexibility and easy configurability for supporting multiple bands. Furthermore, DPLLs may also allow migrating to smaller process nodes. Moreover, a digital loop filter (LF) in a digital implementation of a phase-locked loop may be more immune to noise.

An important figure of merit of a frequency synthesizer is the integrated phase noise within a specified frequency range. One of the contributors to the noise in DPLL implementations is the time-to-digital converter (TDC), which is often used for phase comparison. It may therefore be interesting to reduce the noise of such an implementation.

However, in other fields of technology, time-to-digital converters are used for different reasons, for instance, to measure an elapsed time accurately. Also in these applications, noise properties of a time-to-digital converter or a circuit comprising a time-to-digital converter may be interesting.

SUMMARY

Therefore, a demand exists to reduce noise in a circuit using time-to-digital converter techniques.

This demand may be satisfied by a circuit, a time-to-digital converter, an integrated circuit, a transmitter, a receiver, a transceiver, a method, a program or a means according to any of the independent claims.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
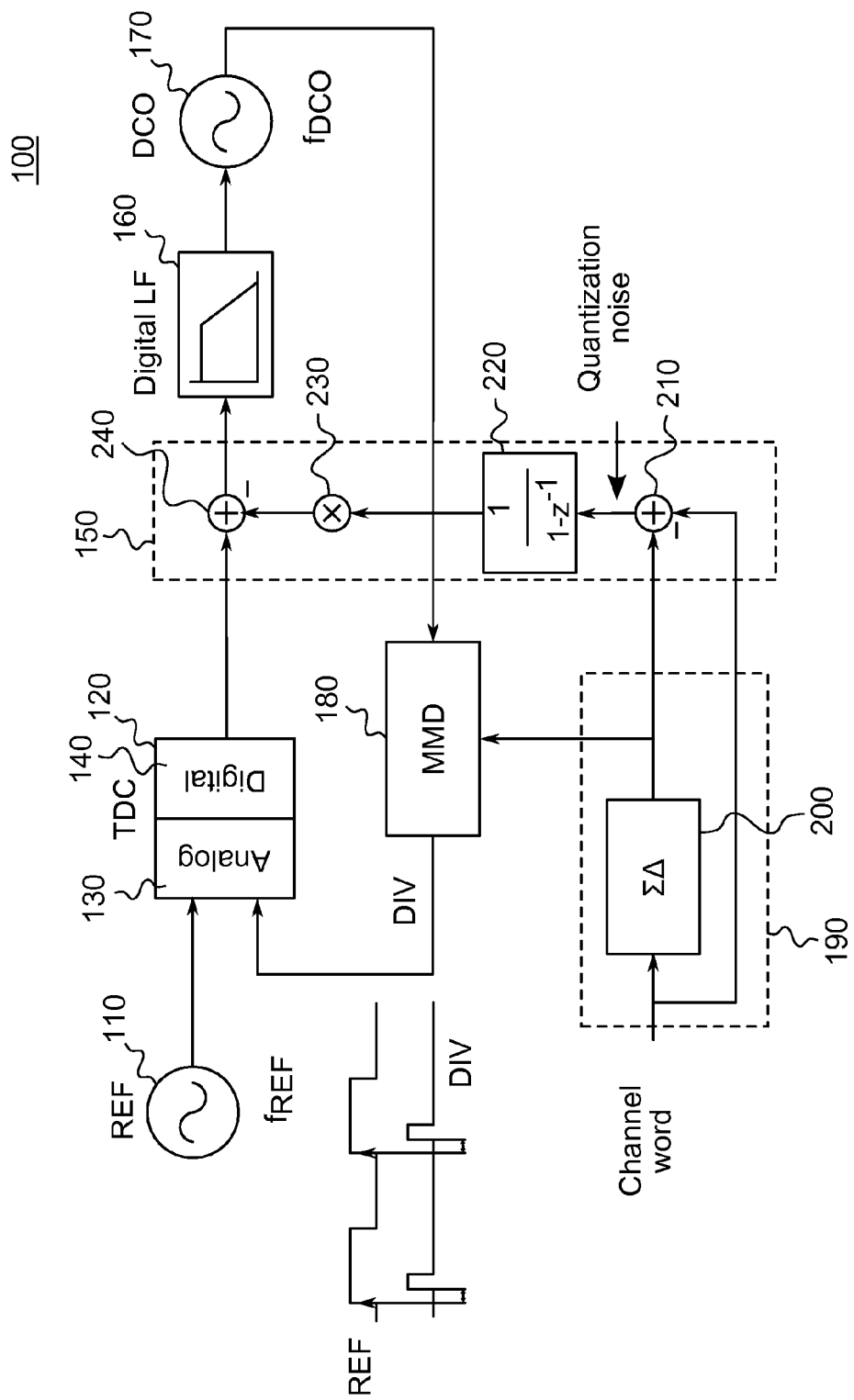
FIG. 1 shows a simplified block diagram of a digital PLL circuit.

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures—will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures. Moreover, summarizing reference signs will be used to refer to more than one structure, element or object or to describe more than one structure, element or object at the same time. Objects, structures and elements referred to by the same, a similar or a summarizing reference sign may be identically implemented. However, one, some or all properties, features and dimensions may also vary from element to element.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

As indicated above, time-to-digital converters (TDC) may be used in a wide variety of technical applications including, for instance, to generate a modulated or an unmodulated local oscillator (LO) signal. Such a local oscillator signal may be used for receiving, transmitting or exchanging data to name just a few examples. For instance, the data may be transmitted, received or exchanged using wireless techniques as well as wire-bound techniques. Examples come from the technical fields of receivers, transmitters and transceivers. These devices may operate in the field of radio frequencies (RF). However, also in other fields of technology including, for instance, measurement techniques, time-to-digital converters are used.

A core block of multi-mode transceivers, receivers and transmitters is the frequency synthesizer. Depending on the implementation, the frequency synthesizer may be used to generate the local oscillator (LO) in the receiver mode (RX mode) of a transceiver or in a receiver. In the case of a transmitter or a transceiver operating, for instance, in the transmitter polar mode (TX polar mode), the frequency synthesizer may be used to generate the phase-modulated carrier.

In many modern implementations, frequency synthesizers are based on digital phase-locked loops (DPLLs). They have become a highly often implemented solution, mainly because of their flexibility and easy configurability for supporting multiple bands. They may, for instance, offer the possibility of migrating to smaller process nodes. The digital loop filters (LF) of DPLLs may also be more immune to noise. A DPLL architecture based on a multi-modulus divider or multi-mode divider (MMD) is schematically illustrated in FIG. 1. In the implementation shown, a time-to-digital converter is used for phase comparison.

FIG. 1 shows a schematic block diagram of a digital PLL circuit 100. The PLL circuit 100 comprises a reference signal generator 110 (REF) which generates the reference signal having a frequency $f_{REF}$. The reference signal is provided to a time-to-digital converter 120 (TDC), which comprises an analog circuit part 130 and a digital circuit part 140. The reference signal is provided to the analog part 130 of the TDC 120.

The time-to-digital converter 120 generates in the example shown in FIG. 1 digital data in the digital circuit part 140 which are coupled via a noise cancellation circuit 150 to a digital loop filter 160 (digital LF). An output of the digital loop filter 160 is then coupled to a digitally-controlled oscillator 170 (DCO), which provides at its output an output signal having a frequency $f_{DCO}$.

The output signal of the digitally-controlled oscillator 170 is fed back via a multi-mode divider 180 (MMD) to the analog circuit part 130 of the time-to-digital converter 120. At the output of the multi-mode divider 180, a feedback signal is generated by the multi-mode divider 180 having a frequency, which is smaller than the frequency $f_{DCO}$ of the digitally-controlled oscillator 170. In FIG. 1 the feedback signal is referred to as DIV as being in terms of its frequency divided.

To be a little more specific, the DPLL circuit 100 as shown in FIG. 1 is a fractional phase-locked loop circuit. By using a channel word, which is also referred to as control value, a divider control signal can be provided by a divider control circuit 190 to the multi-mode divider 180. Here, for the case of a fractional DPPL circuit 100, the divider control circuit 190 comprises a sigma-delta-modulator 200, which receives the channel word and generates the divider control signal based on the channel word.

Both, the divider control signal and the channel word are provided to the noise cancellation circuit 150 to allow a correction of the phase shifts caused by switching the multi-mode divider 180 between at least two dividers. To be a little more specific, the channel word and the divider control signal are provided to a subtractor 210 which is configured in the example shown in FIG. 1 to subtract from the divider control signal the channel word. Therefore, at an output of the subtractor 210 the quantization noise of the sigma-delta-modulator 200 is present.

The noise cancellation circuit 150 further comprises an integrator 220, which integrates the values by the subtractor 210. An output of the integrator 220 is coupled to a multiplier 230 which is used to calibrate the signal provided by the integrator 220 to be subtracted from or added to the data provided by the TDC 120. The calibration by the multiplier 230 may, for instance, compensate phase shifts caused by a delay of processing due to the multi-mode divider 180, the time-to-digital converter 120 and other signal propagation effects or an inherent phase offset by the digitally-controlled oscillator 170 to name just a few examples. The output of the multiplier 230 is then provided to a subtractor 240, which is configured to subtract from the data provided by the TDC 120 the values as generated by the multiplier 230. Also the subtractor 240 may be considered to be part of the noise cancellation circuit 150.

The working principle of the digital PLL circuit 100 as depicted in FIG. 1 is illustrated in a left part of FIG. 1. There, the signal provided by the reference signal generator 110, which is also referred to as REF in the left part of FIG. 1, and the signal provided by the multi-mode divider 180 is shown, which is referred to as DIV in the left part of FIG. 1. Due to the closed feedback loop formed, a phase difference between the reference signal generated by the reference signal generator 110 and the frequency-divided signal of the multi-mode divider 180 exhibit a predetermined phase relationship which may, for instance, be small, for instance, close to zero.

As outlined before, an important figure of merit of the frequency synthesizer and, hence, of a PLL circuit, is the integrated phase noise defined as the closed-loop phase noise integrated within a specified frequency range. For example, for a GSM-receiver architecture, the phase noise is typically integrated from 1 kHz to about 90 kHz. However, for other frequency bands and applications, different frequency ranges may be used. In general, the integrated phase noise is often dominated by the in-band noise performance of the frequency synthesizer.

In a DPLL implementation, some of the main noise contributors to the in-band noise comprise the reference clock noise and the TDC noise, which may be both filtered by the low-pass transfer function implemented in the digital loop filter 160. Moreover, also the digitally-controlled oscillator 170 contributes to the integrated phase noise. Its contribution may be filtered by the high-pass transfer function inherently implemented due to using a multi-mode divider 180 and/or a time-to-digital converter 120.

However, the TDC noise is inherent to the DPLL circuit 100 and comprises white and flicker noise of the analog circuitry as well as white noise due to the phase quantization caused by the finite resolution of the TDC 120.

Compared to analog phase-locked loop circuits, the TDC 120 replaces the phase-frequency detector and the charge-pump in these conventional analog PLLs. The typically larger TDC noise is often seen as a limiting factor when comparing analog and digital PLL circuits in terms of spectral purity of a radio frequency clock or another respective signal. As a consequence, solutions are sought which may be able to reduce the noise contributions from the TDC 120.

A straight-forward approach to lower the in-band phase noise contribution from the TDC 120 is to perform TDC-phase measurements at a higher clock rate, since the TDC noise referred to the RF clock is indirectly proportional to the TDC clock rate. However, the digital-intensive clocks following the TDC 120, for instance, the digital loop filter 160, will also need to run at the higher rate, which causes the power consumption to increase.

Furthermore, the TDC analog noise can be reduced by burning more current, but this may introduce adverse effects and have limitations, such as increased TDC ripple and—higher energy consumption. However, also using an improved low dropout (LDO) voltage regulator design may be used.

In the case the analog TDC noise is already low, the white quantization noise can be further reduced by increasing the TDC resolution. For instance, doubling the resolution gives approximately 6 dB noise reduction. However, the minimum resolution may be limited to the choice of the TDC architecture, for instance by the delay of an inverter given in a particular process. As a consequence, it may only be possible to increase the TDC resolution by an architecture change causing additional costs and increase the desired effort and risk.

As will be laid out in more detail below, an example of a circuit using time-to-digital converter technology, for instance, a time-to-digital converter, may improve its noise behavior by implementing a multi-edge phase comparison technique to lower the in-band noise contribution from the TDC. This basic principle may, for instance, comprise performing the TDC phase comparison at a higher rate, that is, multiple times during a reference clock period, processing the TDC codes at the higher rate in the digital domain and down-sampling to the lower reference clock rate. In other words, examples may be considered as performing an oversampling of the TDC analog and quantization noise.

Figure 2:
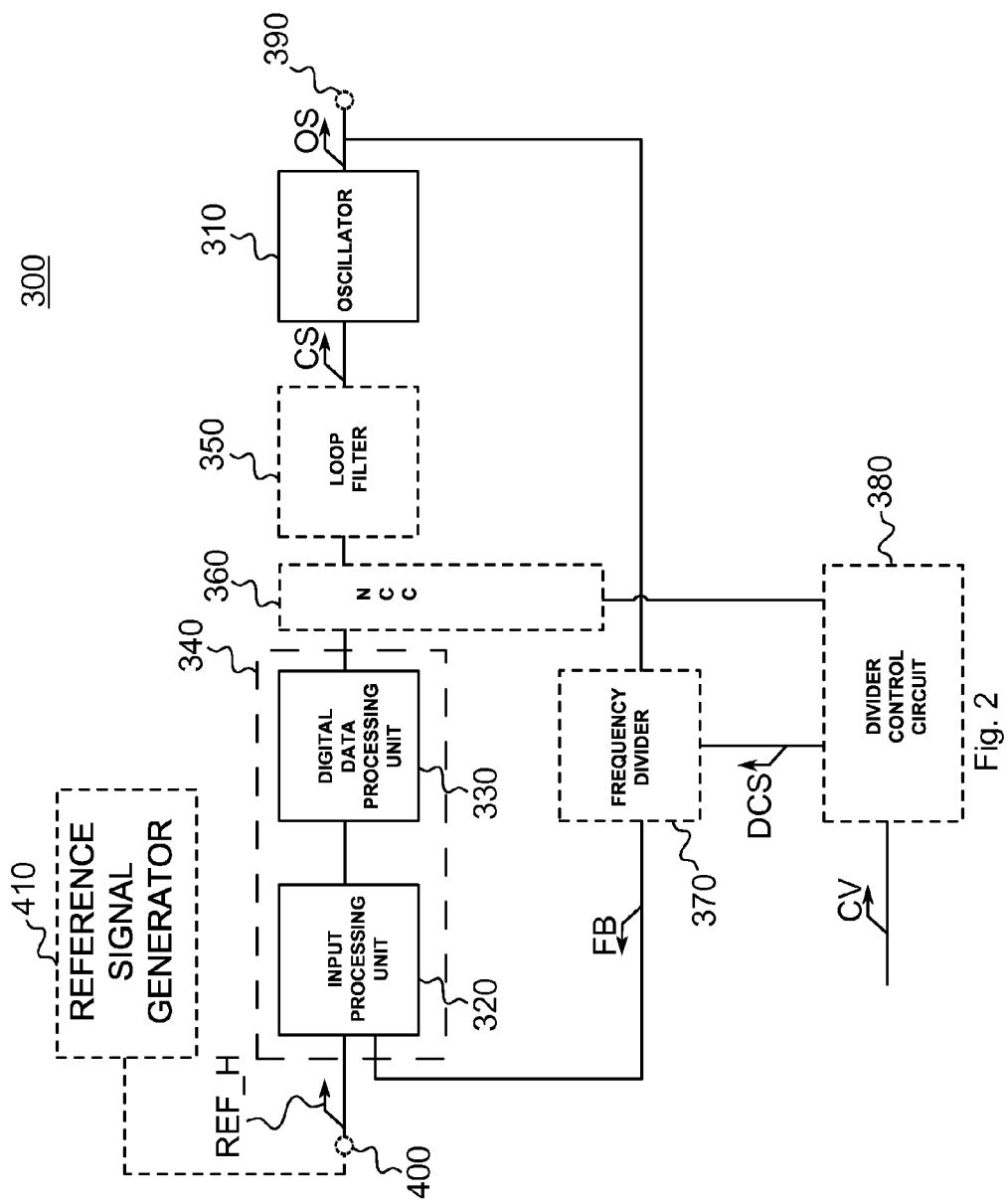
FIG. 2 shows a simplified block diagram of a circuit according to an example including a time-to-digital converter according to an example.

FIG. 2 shows a block diagram of a circuit 300 according to an example. The circuit 300 comprises a controllable oscillator 310, an input signal processing circuit 320 and a digital data processing circuit 330. In the example depicted in FIG. 2, the input processing circuit 320 along with a digital data processing circuit 330 form a time-to-digital converter 340. However, in other examples, the input processing circuit 320 and the digital data processing circuit 330 are by far not required to form a unit as depicted in FIG. 2. In such a case, the circuit may still be employing time-to-digital converter techniques without implementing a time-to-digital converter 340 as a discrete device or a separate part of a circuit implemented, for instance, in an integrated circuit.

The circuit 300 further comprises an optional loop filter 350 which is coupled in between the digital data processing circuit 330 and the controllable oscillator 310. This illustrates that the input processing circuit 320 is only indirectly coupled to the controllable oscillator 310 via the loop filter 350. However, in other examples and, for instance, since the loop filter 350 may be an optional component, the digital data processing circuit 330 may also be directly coupled to a controllable oscillator 310. The circuit 300 further comprises an optional noise cancellation circuit (NCC) 360 which may be coupled somewhere between the output of the input processing circuit 320 and the input of the controllable oscillator 310 or, when the loop filter 350 is implemented, between the output of the input processing circuit 320 and an input of the loop filter 350. The noise cancellation circuit 360 is in the example depicted in FIG. 2 coupled in between the digital data processing circuit 330 and the loop filter 350.

The output of the controllable oscillator 310 is fed back via an optional frequency divider 370 to an input of the input processing circuit 320. However, the frequency divider 370 is by far not required to be implemented.

In the case the frequency divider 370 is implemented as a multi-mode divider or a multi-modulus divider, the circuit 300 may further comprise a divider control circuit 380 which is coupled to the frequency divider 370 and, when implemented, to the noise cancellation circuit 360.

The circuit 300 forms a closed-feedback loop, in which an output signal OS generated by the controllable oscillator 310 is fed back to the input processing circuit 320. In the example depicted in FIG. 2, the frequency divider 370 generates a feedback signal FB as a signal based on the output signal OS, which is then fed back to the input processing circuit 320. The feedback signal is due to the frequency divider 370 a frequency-divided version of the output signal OS.

The input signal processing circuit 320 is designed or configured to receive a reference signal REF_H and the output signal OS or a signal derived from the output signal OS, which is the feedback signal FB in the example shown here. The input processing circuit 320 further generates a sequence of digital values based on the reference signal REF_H and the output signal OS or the signal derived from the output signal OS (feedback signal FB) such that the digital values are indicating or indicative of a phase relation between the reference signal REF_H and the other input signal mentioned before.

The sequence of digital values is then provided to the digital data processing circuit 330, which in turn is designed or configured to generate a sequence of process values at a lower frequency than a frequency of the sequence of digital values. In other words, a frequency of the data provided to the digital data processing circuit 330 is reduced or down-sampled. Moreover, the processed values of the sequence of processed values are each based on a plurality of digital values of the sequence of digital values. In other words, each of the processed values of the sequence of processed values generated by the digital data processing circuit depends at least on two different digital values of the sequence of digital values generated by the input processing circuit 320.

For instance, the sequence of processed values may be generated by digitally processing the plurality of the digital values, which may be a sub-set of the values of the sequence of digital values. For instance, the processing of the plurality of the digital values may comprise a digital filtering of the digital values of the plurality of digital values. The digital filtering may comprise a digital averaging such as an arithmetical averaging based on an order of the sequence of the digital values to name just one example. For instance, a system function indicating or indicative of a processing of the plurality of digital values to obtain a single processed value may take on the form $$i.\ H(z) = \frac{1}{N}\sum_{j=0}^{N-1} z^{-j}, \quad (1)$$

in which N is an integer indicating the number of digital values of the plurality of digital values to be processed. Equation (1) is in the Z-transformation.

In the case of N=2, equation (1) simplifies to $$i.H(z)=\frac{1}{2}\cdot(1+z^{-1}). \quad (2)$$

Figure 3:
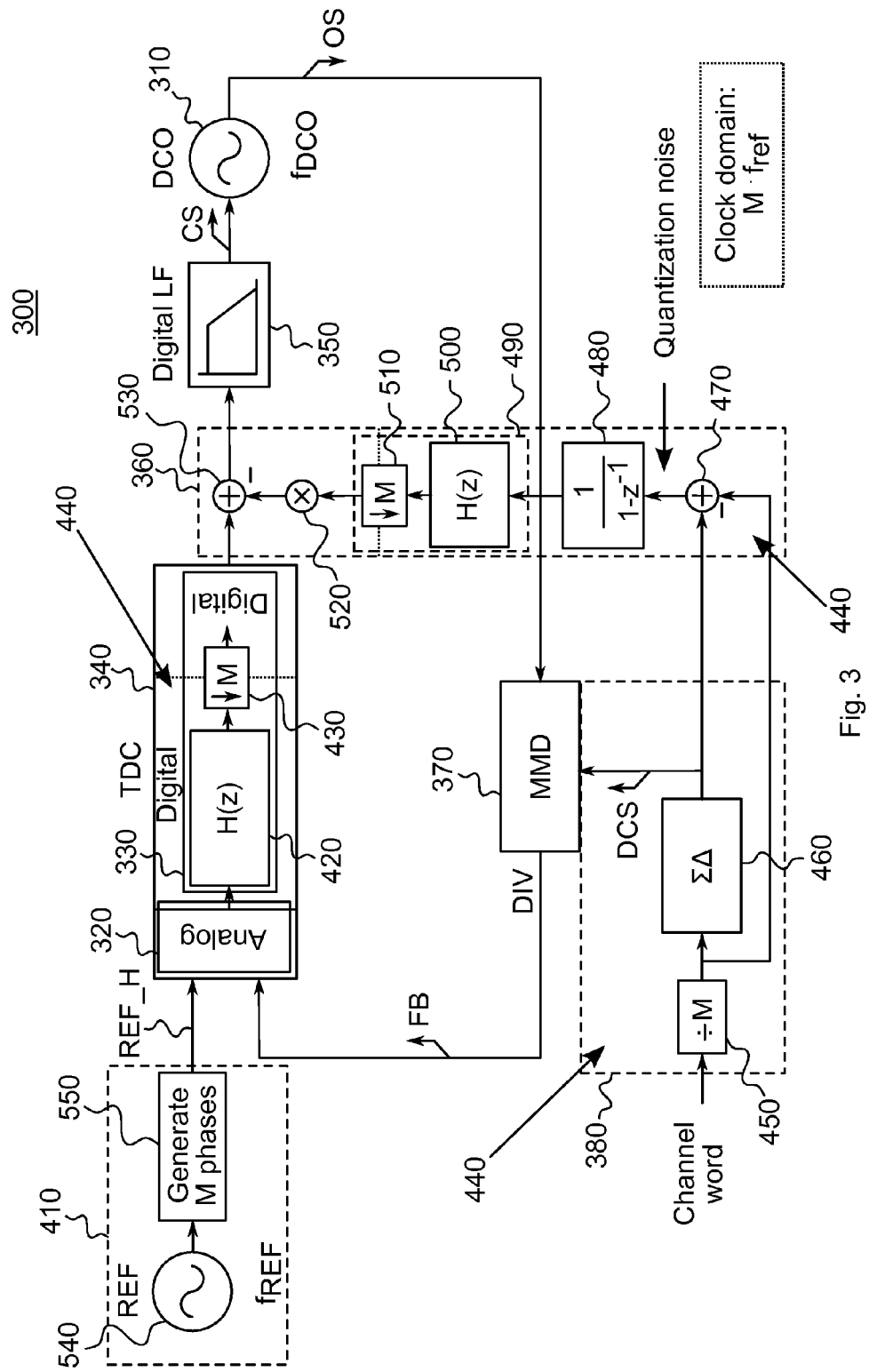
FIG. 3 shows a block diagram of a circuit according to an example comprising a time-to-digital converter according to an example.

As will be laid out in more detail in the context of FIG. 3, the noise cancellation circuit coupled between the input signal processing circuit 320 and the controllable oscillator 310 is designed to compensate a phase shift caused by switching the divider of the frequency divider 370. To facilitate this, the noise cancellation circuit 360 may, for instance, generate a cancellation signal, which is then combined with the data or signals received by the noise cancellation circuit 360. In the example shown here, the cancellation signal may be combined with the sequence of processed values provided by the digital data processing circuit 330.

The loop filter 350 is designed or configured to generate a control signal based on the signals it receives. Here, in the example depicted in FIG. 2, the loop filter 350 receives the processed values, which may optionally be combined with a cancellation signal internally used by the noise cancellation circuit 360. Based on the control signal CS, the controllable oscillator 310 generates the output signal OS. As a consequence, the control signal CS is based on a sequence of process values.

As outlined before, the frequency divider 370 is by far not required to be a mandatory entity. In the case the frequency divider is not implemented, the input processing circuit 320 is provided with the output signal OS closing the feedback loop directly. In this case, the frequency of the output signal OS may be equal to that of the reference signal REF_H.

However, to generate based on a lower frequency of the reference signal REF_H, the output signal OS with a higher frequency, implementing the frequency divider 370 may be an interesting option. To be able to adapt the frequency of the output signal OS a multi-modulus or a multi-mode divider may be used as the frequency divider 370. The frequency divider 370 may in this case be capable of switching between different dividers concerning the frequency to allow the output signal OS to be frequency divided by different dividers according to a divider control signal DCS, which may be provided by the divider control circuit 380 by providing the frequency divider 370 with an appropriate divider control signal DCS.

In the case the frequency divider 370 is operating at a fixed, integer value, the circuit 300 may be an integer phase-locked loop circuit (integer PLL circuit). However, it may also be possible to choose fractional dividers by, for instance, switching between two or more different dividers. In this case, the circuit 300 may be considered a fractional phase-locked loop circuit (fractional PLL circuit). In this case, the divider control circuit 380 may provide the frequency divider 370 with a divider control signal DCS causing the frequency divider 370 to switch between at least two different dividers. Switching between at least two different dividers may in this case comprise switching back and forth in a repeated manner between the respective dividers. In the case of implementing a fractional PLL circuit as the circuit 300, implementing the noise cancellation circuit 360 may be interesting to compensate for phase shift due to the switching between the different dividers. However, also in the case of an integer PLL circuit allowing different frequencies of the output signal OS to be generated, the divider control signal DCS may be generated based on a control value CV provided to the divider control circuit 380.

The circuit 300 may be capable of providing the output signal OS having a predetermined phase relationship with respect to the reference signal REF_H. In terms of their frequencies, the output signal OS may have the same frequency as the reference signal REF_H, but may also have a higher or lower frequency. Depending on the frequency divider 370 and the divider control circuit 380, if implemented, a ratio of the frequency of the output signal OS with respect to the frequency of the reference signal REF_H may be an integer value or a fractional value (for instance larger than one).

Naturally, the circuit 300 may comprise an optional terminal 390 at which the output signal OS is obtainable. Similarly, the circuit 300 may also comprise a terminal 400 for providing the reference signal REF_H to the input processing circuit 320. Additionally or alternatively, the circuit 300 may also comprise a reference signal generator 410 which is designed or configured to generate the reference signal REF_H. As will be laid out in more detail below, the reference signal generator 410 may, for instance, comprise a reference clock signal generator configured to generate a reference clock signal at a lower frequency, which is also referred to as REF. In this case, the reference signal generator 410 may further comprise a frequency multiplier circuit being designed or configured to generate the reference signal REF_H as a frequency multiplied signal based on the reference clock signal REF.

As outlined before, the circuit 300 uses a principle allowing a multi-edge phase comparison technique to lower the in-band noise contribution from the components of the time-to-digital converter 340. The actual phase comparison performed by the time-to-digital converter 340 is performed at a higher rate, for instance, multiple times during a reference signal period. The TDC codes or digital values generated by the input processing circuit 320 of the TDC 340 may then be processed in the digital domain at a higher rate. During this processing or in a separate step of downsampling, the resulting process values have a frequency lower than the frequency at which the input processing circuit 320 operates. In other words, the sequence of processed values is a down-sampled and processed version of the sequence of digital values provided by the input processing circuit 320, for instance, at the lower reference signal rate or frequency. The circuit 300 may, therefore, be considered as performing oversampling of the TDC analog and quantization noise.

Compared to more conventional solutions, down-sampling to the lower rate and running the digital loop filter 350 at the lower rate may help to save power compared to running all components a the higher rate. The performance improvement in either case may be expected to be approximately the same. Moreover, multi phases per reference clock period may be generated with only little increase in power and modest hardware overheads. The technique may improve a trade-off between power and performance in a digital PLL circuit without requiring a redesign of the time-to-digital converter and may be applicable to many TDC architectures. For example, the technique may allow to be simply switched on in 2G-mode, where a better phase-noise performance may be required compared to operating in the 3G-mode to take just one example from wireless communications.

FIG. 3 shows a simplified block diagram of another example of a circuit 300 according to an example. The circuit 300 resembles that of FIG. 2, but shows some additional and alternative implementation-specific details, which will be outlined below in more detail. As a consequence, reference is made to the description of FIG. 2 and the circuit 300 shown there.

The circuit 300 once again comprises a controllable oscillator 310, which is implemented as a digitally-controlled oscillator (DCO) providing the output signal OS having the frequency $f_{DCO}$.

The circuit 300 further comprises a frequency divider 370 which is implemented as a MMD or multi-modulus divider.

The frequency divider 370 generates the feedback signal FB on the basis of the output signal OS by dividing its frequency according to a divider, which is determined by the divider control circuit 380.

The feedback signal FB is provided to the input processing circuit 320 or the time-to-digital converter 340 (TDC). The input processing circuit 320 comprises both, parts of the analog part of a time-to-digital converter 340 as well as parts of the digital part of the TDC 340. Naturally, the time-to-digital converter 340 also comprises the digital data processing circuit 330, which is part of the digital domain of the TDC 340. Here, the digital data processing circuit 330 comprises a filter 420 and a down-sampler 430, which is designed to reduce the frequency of the signal by a factor of M. Due to the down-sampler 430 a high operational frequency domain 440 exists, which is illustrated by the dotted line in the TDC 340. The operational frequency of the high operation frequency domain, which is also referred to as a clock domain, is in the example depicted here $M \cdot f_{REF}$.

The circuit 300 further comprises a noise cancellation circuit 360, which will be described in more detail below.

The noise cancellation circuit 360 is coupled to a digital loop filter 350, which is once again designed or configured to generate the control signal for the controllable oscillator 310. The loop filter 350 uses the sequence of process data which may be modified by the noise cancellation circuit 360 to generate the control signal CS.

As mentioned before, the frequency divider 370 is implemented here as a multiple modulus divider or multi-mode divider. The circuit 300 is a fractional PLL circuit. To allow the frequency divider to divide the frequency of the output signal OS by a non-integer, fractional value, the multi-modulus divider or frequency divider 370 switches between at least two different dividers in response to the divider control signal DCS generated by the divider control circuit 380. Here, the control value CV (not referred to as CV in FIG. 3) in the form of a channel word is provided to the divider control circuit 380. Also the divider control circuit 380 may be operating in the high operational frequency domain 440 as defined before.

To allow the control value or channel word to be adapted accordingly, the channel word may be divided by a divider 450 dividing the channel word by a factor of M. The divided channel word or divided control value CV is then provided to a sigma-delta-modulator 460, which generates the divider control signal DCS in the form of a high-speed bit sequence switching the CV divider 370 between at least two dividers. For instance, the divider 450 may be implemented by simply deleting or neglecting bits of the channel word, when, for instance, the channel word is to be divided by a power of two. In other words, when M is a power of two, the divider 450 may be implemented by simply discarding bits of the channel word of by shifting the channel word to the lower significant bit by the appropriate number of bits.

Naturally, it is by far not necessary to operate the divider control circuit 380 also in the high operation frequency domain 440 as depicted in FIG. 3. The frequencies of the high operational frequency domains 440 of the TDC 340 and the divider control circuit 380 may be different or may be the same and, for instance, coincide with the frequency of the sequence of digital values.

As mentioned before, the circuit 300 as depicted in FIG. 3 is a fractional PLL circuit. Accordingly, due to switching the divider of the frequency divider 370 between at least two different divider values, depending on the divider control circuit 380 an additional phase shift is created. This phase shift may be compensated by the noise cancellation circuit 360. To facilitate this, the noise cancellation circuit 360 comprises a subtractor 470 which is designed to subtract from the divider control signal (DCS) the optionally divided channel word control value. The resulting value represents a source of the quantization noise of the fractional PLL circuit and, especially, of the sigma-delta-modulator 460. To reduce the quantization noise and to improve the compensation of the phase shift, the noise cancellation circuit 360 comprises an integrator 480, which is capable of integrating the values provided to it, which are in turn indicating an incremental phase shift caused by switching between the different dividers of the frequency divider 370.

The integrated values are then provided to a further digital data processing circuit 490, which is similar to the digital data processing circuit 330 of the TDC 340. Also, the further digital data processing circuit 490 comprises a filter 500 along with a down-sampler 510 which is designed to reduce the frequency of the data provided to it by a factor of M. The further digital data processing circuit 490 generates from the values provided by the integrator 480, which are indicating an over-all phase shift, a corresponding sequence of values by applying the system function H(z) and by down-sampling the sequence in terms of its frequency. The system function of the filter 500 of the noise cancellation circuit 360 may be equal to the system function of the filter 420.

Due to down-sampling the sequence of values obtained from the integrator 480, the noise cancellation circuit 360 as depicted in FIG. 3 comprises once again a high operation frequency domain 440 and a lower operation frequency domain, the border of which is indicated in FIG. 3 by a dotted line. Also here the high operational frequency domain 440 may share the same frequency as the frequency of the digital values generated by the input processing circuit 320.

Depending on the implementation, it may be advisable to calibrate the data obtained from the further digital data processing circuit 490 by multiplying these values in order to be directly combinable to the sequence of processed data provided by the TDC 340 or its digital data processing circuit 330. Accordingly, the noise cancellation circuit 360 comprises a multiplier 520 to generate the previously-mentioned cancellation signal. The cancellation signal is then combined using a combiner 530, which may be a subtractor, to combine the cancellation signal and the sequence of processed values provided by the TDC 340. Here, in the example depicted in FIG. 3, the cancellation signal is subtracted from the sequence of processed values of the TDC 340. Naturally, in other examples, a different combiner may be used.

In the example depicted in FIG. 3, the noise cancellation circuit 360 is directly coupled to the output of the digital data processing circuit 330. In other examples, the noise cancellation circuit 360 may also be coupled directly to an input of the digital data processing circuit 330 as will be laid out in more detail below. In this case, the TDC 340 might not be implemented as a closed circuit or unit, but the circuit 300 may be implemented as a circuit based on a time-to-digital converter technology. However, as mentioned before, an example will be outlined in more detail below.

It is to be noted that the circuit 300 as depicted in FIG. 3 operates in the high operational frequency domain 440 with an M-multiple of a reference frequency $f_{REF}$ generated by the reference signal generator 410. The reference signal generator 410 comprises a reference clock signal generator 540 and a frequency multiplier circuit 550, which generates M phases or edges based on the reference clock signal generated by the reference clock signal generator 540. The output of the frequency multiplier circuit 550 having the frequency $M \cdot f_{REF}$ is then provided to the time-to-digital converter 340 as the reference signal REF_H. The additional term "_H" refers to frequency being higher by the factor of M.

In the case of factor M being equal to a power of 2, the frequency multiplier circuit 550 may, for instance, be implemented using a combination of a delay line and a XOR-gate (XOR=Exclusive OR).

In other words, in the DPLL architecture with possibility of a multi-edge phase comparison, the digital codes from the measurements of the phase relations between the reference signal REF_H and the feedback signal FB are processed by a digital filter H(z) and down-sampled back to the reference clock rate as provided by the reference clock signal generator 540. The multiple edges of the reference signal REF_H for the phase measurements may be generated directly from the reference clock 540 by using simple circuitry. In application scenarios, the corresponding reference signal may even be available, for instance, a multi-phase reference oscillator to name just one example.

In the DPLL circuit 300, the controllable oscillator 310 (DCO) generates the output signal with a frequency which is given by $$i.f_{DCO} = N \cdot f_{REF}. \quad (3)$$

Here, N is the nominal divider value of the frequency divider 370 (NMD) as indicated by the control value or channel word. In the architecture as depicted in FIG. 3, the M phases generated from the reference clock signal REF_H are used for multi-edge phase comparison so that the reference frequency is effectively $M \cdot f_{REF}$. Thus, the channel word or control value may have to be divided by a factor M to obtain the same DCO frequency:

$$a. \quad f_{DCO} = N \cdot f_{REF} = \left(\frac{N}{M}\right) \cdot (M \cdot f_{REF}). \quad (4)$$

Moreover, the sigma-delta-modulator 460 (ΣΔ) controlling the frequency divider 370 may also run at the high rate frequency $M \cdot f_{REF}$. As a consequence, it produces M edges for the phase comparison. The M codes or digital values in the TDC 340 at the output of the input processing circuit 320 during every clock period are filtered by the digital data processing circuit 330 through the digital filter 420 (system function H(z)) at the high rate and down-sampled to the low rate before being processed in the digital loop filter 350. The filter H(z) may be implemented to have desired filtering properties, using typically only shifts and adders.

To correctly cancel the quantization noise of the sigma-delta-modulator 460 at the output of the TDC 340, the same filter H(z) running at the high rate followed by a decimation-by-M may be applied in the noise cancellation path or circuit 360. Both, the digital loop filter 350 and the multiplier 520 for scaling the cancellation signal remain at the low rate. Moreover, as the sigma-delta modulator 460 and the noise cancellation circuits 360 use only shifts and adders, only a marginal increase in the digital power consumption may be expected.

Naturally, as an alternative to the described architecture, to save digital power, it is possible to run both, the sigma-delta modulator 460 and the noise cancellation circuit 360 at the lower rate. This may, however, lead to an increase of the input delay variation at the TDC 340 and thereby impact the analog power consumption. Moreover, some TDC architectures might work efficiently in terms of power and noise in this case or scenario. As a further alternative, it may be possible to apply the filter H(z) and the down-sampling or—in other words—the digital data processing circuit 330 after the subtraction performed by the combiner 530 in the example depicted in FIG. 3. This might be beneficial, when the TDC digital part is simple and the multiplier 520 may be omitted in the noise cancellation circuit 360.

Figure 4:
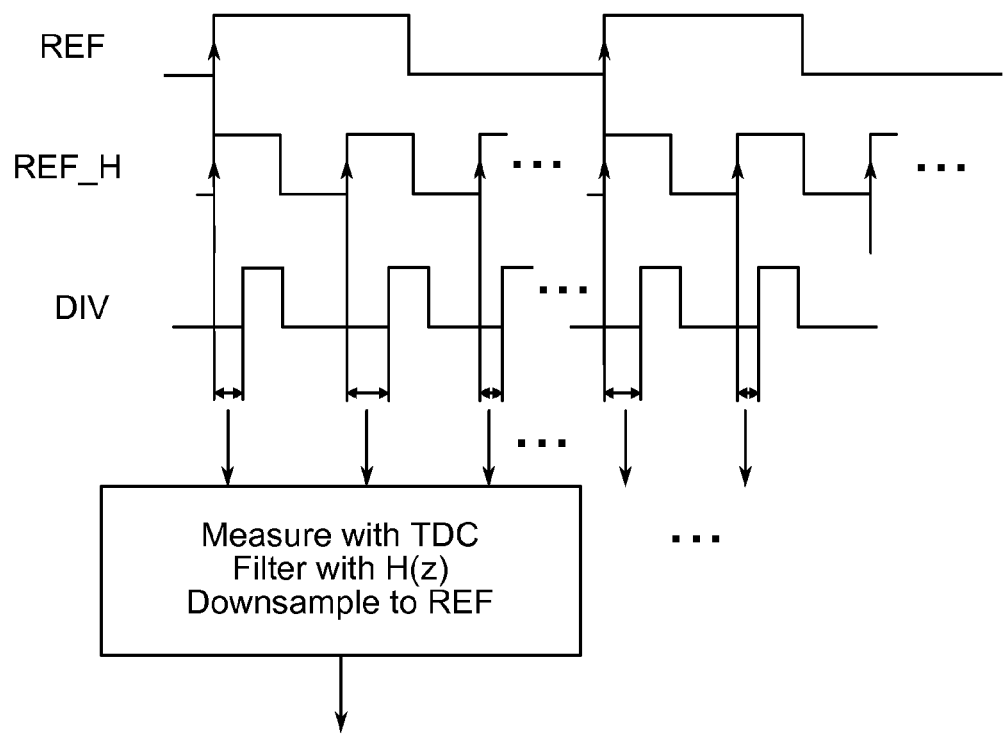
FIG. 4 illustrates the principle of a multi-edge phase comparison.

FIG. 4 illustrates the principle of a multi-edge phase comparison based on the circuit shown in FIG. 3. To be a little more specific, the upper curve in FIG. 4 illustrates the reference clock signal REF as generated by the reference clock signal generator 540 of the reference signal generator 410. The center curve shows the reference signal REF_H as generated by the reference signal generator 410. The frequency of the reference signal REF_H is increased by a factor of M with respect to the frequency of the reference clock signal REF depicted above. In the lower part of FIG. 4, the feedback signal FB or DIV as generated by the frequency divider 370 is depicted. As indicated by the horizontal arrows, the TDC 340 is capable of measuring the phase differences and applying the filter with a system function H(z) and to down-sample the sequence of process values to the frequency of the reference clock signal REF.

In other words, in a conventional DPLL circuit 100 as depicted in FIG. 1, the TDC 120 is capable only of measuring the phase difference between the reference clock REF and the MMD output DIV once every reference clock period. In contrast, in the multi-edge phase comparison technique, the TDC 340 performs phase measurements multiple times during every period as illustrated in the examples of FIGS. 2 and 3.

For instance, the concept has been shown to work using the parameter M of (2) and using a moving-average filter with the transfer function previously defined in equation (2). Hence, the TDC codes or sequence of digital values are averaged per reference clock period at the high rate $2 \cdot f_{REF}$ and referred back to the frequency $f_{REF}$, giving a TDC noise improvement of approximately 3 dB. The second edge for the phase comparison can, as outlined before, be generated by a logical XOR gate and the reference clock with a delayed version of itself using, for instance, an appropriately designed delay line. Measurements show for the case M=2—that the described architecture gives the expected 3 dB improvement in the in-band noise and, hence, also a reduction of the integrated phase noise.

Examples may, therefore, allow reducing noise from the TDC, which may be used as a digital frequency synthesizer for RF signal generation, in applications such as RF receivers, transceivers, transmitters, I/O clocking for serial devices, graphics applications and so on. Examples may allow a greater flexibility in trading-off power and phase-noise performance in digital frequency synthesizers, which may help to develop a versatile and agile architecture that can be used across different projects and macros including, for instance, 2G, 3G, LTE, WiFi, FM radio, Bluetooth and other applications. Examples may therefore comprise digital PLLs with multi-edged phase comparison, which can be used in digital PLL circuits, frequency synthesis, time-to-digital converters and so on. Examples may, for instance, be used in high volume architectures comprising computer system architectures and features, interfaces made in high volumes, devices such as transistors and associated manufacturing processes.

Naturally, examples also comprise time-to-digital converters 340 which may be used in a different field of application than the previously explained and outlined application in the field of wireless communication systems. For instance, TDCs may be used to measure events or time periods between events. Accordingly, in such a case the input signal processing circuit 320 of the TDC 340 may be configured to receive at least one input signal and configured to generate the sequence of digital values indicating time intervals concerning events comprised in the at least one input signal. The previously-mentioned phase relationship between the reference signal REF_H and the feedback signal FB is just one example of such an event.

Figure 5:
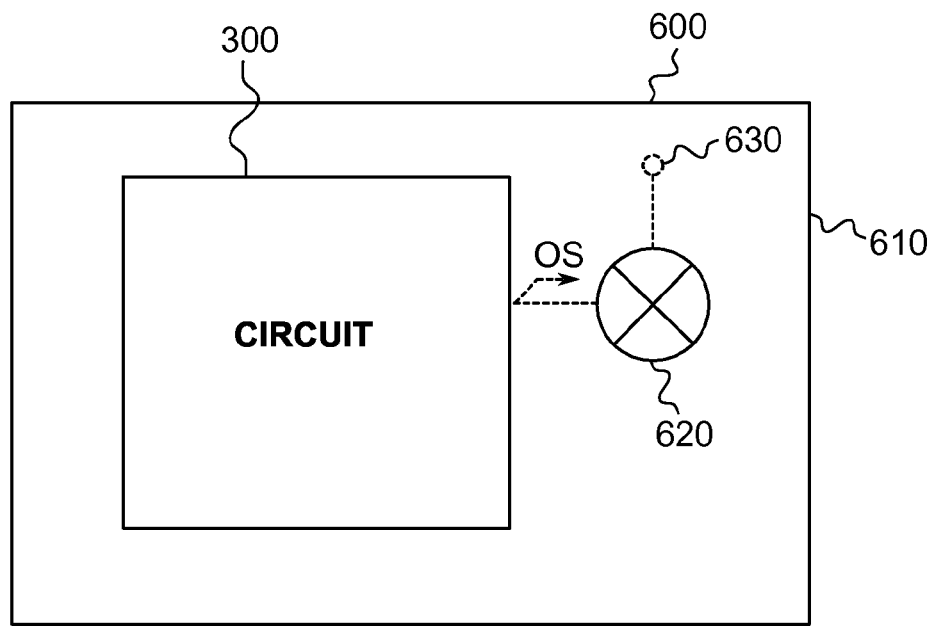
FIG. 5 shows a simplified block diagram of an integrated circuit.

FIG. 5 shows a simplified block diagram of an integrated circuit 600 comprising a substrate 610 which may be a semiconductor die. The substrate 610 comprises a circuit 300 as explained before, the output of which is coupled to a mixer 620. The output of the circuit 300, which may be the output of the controllable oscillator 310 at which the output signal OS is available, can, hence, be used as a local oscillator signal for mixing or down-mixing another signal by the mixer 620. A terminal 630 may also be coupled to the multiplexer 620 to provide the signal to be down-mixed to the mixer 620 or to obtain the up-mixed signal from the mixer 620 and, for instance, to couple the integrated circuit 600 to an antenna.

Naturally, FIG. 5 only shows one example of an integrated circuit 600. Circuits 300 according to examples may also be used in other non-wireless communication systems related application scenarios.

Figure 6:
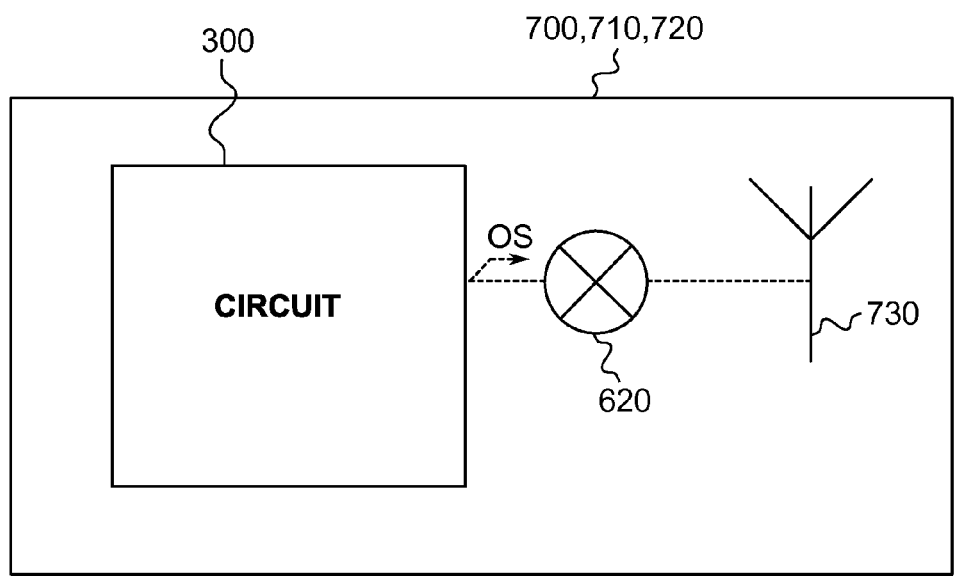
FIG. 6 shows a simplified block diagram of a receiver, a transmitter or a transceiver according to an example.

FIG. 6 shows a simplified block diagram of a receiver 700, a transceiver 710 or a transceiver 720, which comprises a circuit 300 as described before. At an output of the circuit 300, which may once again coincide with the output of the controllable oscillator 310, a mixer 620 is coupled to receive the output signal OS from the controllable oscillator 310 (not shown in FIG. 6). Moreover, the mixer 620 is coupled to an antenna 730 to receive or to provide a signal to be processed by the mixer 620 or to transmit a processed signal processed by the mixer 620, respectively.

Naturally, a circuit 300 may also be used in other fields of applications concerning a receiver, a transmitter or a transceiver. Therefore, implementing the circuit 300 in the context of a mixer 620 is by far not necessary.

Figure 7:
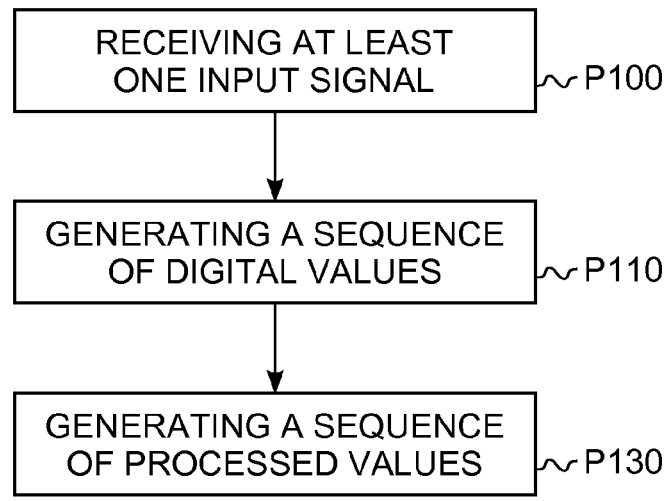
FIG. 7 shows a flowchart of a method according to an example.

FIG. 7 shows a flowchart of a method according to an example relating to a time-to-digital converter 340. In a process P100, at least one input signal is received. In a process P110, a sequence of digital values indicating time intervals concerning events comprised in the at least one input signal is generated. Finally, in a process P130, a sequence of processed values is generated at a lower frequency than a frequency of the sequence of the digital values. As outlined before, each processed value is based on a plurality of the digital values of the sequence of digital values.

Naturally, the processes are by far not required to be performed in the indicated order of FIG. 7. The processes may be performed in an arbitrary order, timely overlapping or even simultaneously. Naturally, the processes may also be performed several times or in a loop.

Figure 8:
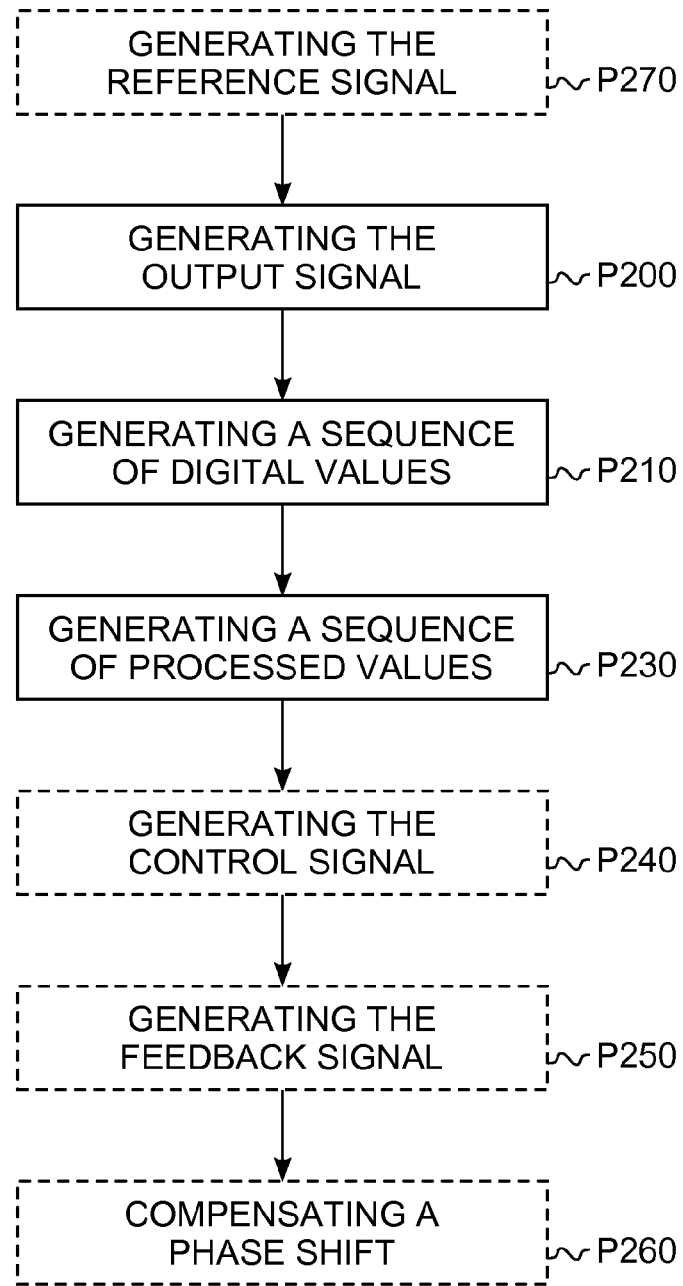
FIG. 8 shows a flowchart of another method according to an example.

Finally, FIG. 8 shows a flowchart of a method for generating an output signal depending on a reference signal. In a process P200 the output signal OS is generated based on a control signal CS. In a process P210, the reference signal is received and a sequence of digital values indicating a phase relation between the reference signal and the output signal or a signal derived from the output signal is generated. In a process P230, a sequence of processed values is generated at a lower frequency than a frequency of the sequence of the digital values. Each processed value is once again based on a plurality of the digital values of a sequence of digital values, wherein the control signal is based on the processed values.

In an optional process P240, the control signal may be generated based on the processed digital values. Moreover, in an optional process P250, the feedback signal may be generated as the signal derived from the output signal. The feedback signal may be a frequency-divided output signal. Naturally, in a further optional process P260, the method may comprise compensating a phase shift, which may be caused by switching the frequency divider 370 or choosing different dividers during generating the feedback signal in the process P250. In another optional process P270, the reference signal may be generated.

As outlined before, naturally, the order of the processes as indicated in FIG. 8 may be changed. Furthermore, the individual processes may be performed simultaneously or timely overlapping. Naturally, the processes may also be performed several times, for instance in the form of a loop.

In the following examples pertain to further examples.

Example 1 is a circuit comprising a controllable oscillator configured to generate an output signal based on a control signal; an input signal processing circuit configured to receive a reference signal and to generate a sequence of digital values indicating a phase relation between the reference signal and the output signal or a signal derived from the output signal; and a digital data processing circuit configured to generate a sequence of processed values at a lower frequency than a frequency of the sequence of the digital values, wherein each processed value is based on a plurality of the digital values of the sequence of digital values, and wherein the control signal is based on the sequence of processed values.

In example 2, the subject matter of example 1 may optionally include the digital data processing circuit being configured to generate the sequence of processed values by digitally processing the plurality of the digital values.

In example 3, the subject matter of example 2 may optionally include digitally processing the plurality of the digital values comprising digitally filtering the digital values of the plurality of digital values.

In example 4, the subject matter of example 3 may optionally include digitally filtering the plurality of the digital values comprising digitally averaging the digital values of the plurality of digital values.

In example 5, the subject matter of example 4 may optionally include averaging the digital values of the sequence of digital values comprising arithmetically averaging the digital values based on an order of sequence of the digital values.

In example 6, the subject matter of any of the examples 1 to 5 may optionally include a loop filter coupled between the digital data processing circuit and the controllable oscillator and configured to generate the control signal based on the processed values.

In example 7, the subject matter of any of the examples 1 to 6 may optionally include a frequency divider coupled between the controllable oscillator and the input signal processing circuit to provide the input signal processing circuit with a feedback signal as the signal derived from the output signal, the feedback signal being the frequency divided output signal.

In example 8, the subject matter of example 7 may optionally include the frequency divider being a multimodulus divider configured to divide the frequency of the output signal by one of at least two different dividers to provide the feedback signal in response to a divider control signal.

In example 9, the subject matter of example 8 may optionally include a divider control circuit configured to generate the divider control signal based on a control value.

In example 10, the subject matter of example 9 may optionally include the divider control circuit being configured to generate the divider control signal such that the multi-modulus divider switches between at least two different dividers.

In example 11, the subject matter of any of the examples 8 to 10 may optionally include the divider control circuit operating at a higher operating frequency than the frequency of sequence of processed values.

In example 12, the subject matter of example 11 may optionally include the divider control circuit operating at the same operation frequency as the frequency of the sequence of digital values.

In example 13, the subject matter of any of the examples 8 to 12 may optionally include the divider control circuit comprising a sigma-delta-modulator to generate the divider control signal.

In example 14, the subject matter of example 13 may optionally include the divider control circuit further comprising a divider to divide the control value according to the ratio of the frequency of the sequence of the digital values with respect to the frequency of sequence of processed values.

In example 15, the subject matter of any of the examples 8 to 14 may optionally include a noise cancellation circuit coupled between the input signal processing circuit and the controllable oscillator and configured to compensate a phase shift caused by a switching of the divider.

In example 16, the subject matter of example 15 may optionally include the noise cancellation circuit comprising an integrator configured to integrate values indicative of an incremental phase shift to obtain a value indicative of an over-all phase shift.

In example 17, the subject matter of example 16 may optionally include a further digital data processing circuit to generate a sequence of values indicative of the over-all phase shift.

In example 18, the subject matter of example 17 may optionally include the further digital data processing circuit being configured to generate the sequence of values indicative of the over-all phase shift using the same system function as the digital data processing circuit, wherein the system function is indicative of processing the plurality of digital values to obtain a processed value.

In example 19, the subject matter of any of the examples 15 to 18 may optionally include the noise cancellation circuit further comprising a multiplier configured to generate a cancellation signal based on the values indicative of the over-all phase shift, wherein the noise cancellation circuit is configured to combine the cancellation signal with the signal received by the noise cancellation circuit.

In example 20, the subject matter of any of the examples 15 to 19 may optionally include the noise cancellation circuit being directly coupled to an output of the digital data processing circuit.

In example 21, the subject matter of any of the examples 15 to 19 may optionally include the noise cancellation circuit being directly coupled to an input of the digital data processing circuit.

In example 22, the subject matter of any of the examples 1 to 21 may optionally include a reference signal generator configured to generate the reference signal.

In example 23, the subject matter of example 22 may optionally include the reference signal generator comprising a reference clock signal generator configured to generate a reference clock signal and a frequency multiplier circuit, the frequency multiplier circuit being configured to generate the reference signal as a frequency multiplied signal based on the reference clock signal.

Example 24 is a time-to-digital converter comprising an input signal processing circuit configured to receive at least one input signal and to generate a sequence of digital values indicating time intervals concerning events comprised in the at least one input signal; and a digital data processing circuit configured to generate a sequence of processed values at a lower frequency than a frequency of the sequence of the digital values, wherein each processed value is based on a plurality of the digital values of the sequence of digital values.

In example 25, the subject matter of any example 24 may optionally include the digital data processing circuit being configured to generate the sequence of processed values by digitally processing the plurality of the digital values.

In example 26, the subject matter of example 25 may optionally include digitally processing the plurality of the digital values comprising digitally filtering the digital values of the plurality of digital values.

In example 27, the subject matter of example 26 may optionally include digitally filtering the plurality of the digital values comprising digitally averaging the digital values of the plurality of digital values.

In example 28, the subject matter of example 27 may optionally include averaging the digital values of the sequence of digital values comprising arithmetically averaging the digital values based on an order of sequence of the digital values.

Example 29 is a circuit comprising a controllable oscillator configured to generate an output signal based on a control signal; a time-to-digital converter comprising an input signal processing circuit configured to receive a reference signal and to generate a sequence of digital values indicating a phase relation between the reference signal and the output signal or a signal derived from the output signal, and a digital data processing circuit configured to generate a sequence of processed values at a lower frequency than a frequency of the sequence of the digital values, wherein each processed value is based on a plurality of the digital values of the sequence of digital values, and wherein the control signal is based on the processed values.

In example 30, the subject matter of example 29 may optionally include the digital data processing circuit being configured to generate the sequence of processed values by digitally processing the plurality of the digital values.

In example 31, the subject matter of example 30 may optionally include digitally processing the plurality of the digital values comprising digitally filtering the digital values of the plurality of digital values.

In example 32, the subject matter of example 31 may optionally include digitally filtering the plurality of the digital values comprising digitally averaging the digital values of the plurality of digital values.

In example 33, the subject matter of example 32 may optionally include averaging the digital values of the sequence of digital values comprising arithmetically averaging the digital values based on an order of sequence of the digital values.

In example 34, the subject matter of any of the examples 29 to 33 may optionally include a loop filter coupled between the digital data processing circuit and the controllable oscillator and configured to generate the control signal based on the processed values.

In example 35, the subject matter of any of the examples 29 to 34 may optionally include a frequency divider coupled between the controllable oscillator and the input signal processing circuit to provide the input signal processing circuit with a feedback signal as the signal derived from the output signal, the feedback signal being the frequency divided output signal.

In example 36, the subject matter of example 35 may optionally include the frequency divider being a multi-modulus divider configured to divide the frequency of the output signal by one of at least two different dividers to provide the feedback signal in response to a divider control signal.

In example 37, the subject matter of example 36 may optionally include a divider control circuit configured to generate the divider control signal based on a control value.

In example 38, the subject matter of example 37 may optionally include the divider control circuit being configured to generate the divider control signal such that the multi-modulus divider switches between at least two different dividers.

In example 39, the subject matter of any of the examples 36 to 38 may optionally include the divider control circuit operating at a higher operating frequency than the frequency of sequence of processed values.

In example 40, the subject matter of example 39 may optionally include the divider control circuit operating at the same operation frequency as the frequency the sequence of digital values.

In example 41, the subject matter of any of the examples 36 to 40 may optionally include the divider control circuit comprising a sigma-delta-modulator to generate the divider control signal.

In example 42, the subject matter of example 41 may optionally include the divider control circuit further comprising a divider to divide the control value according to the ratio of the frequency of the sequence of the digital values with respect to the frequency of the sequence of processed values.

In example 43, the subject matter of any of the examples 36 to 42 may optionally include a noise cancellation circuit coupled between the input signal processing circuit and the controllable oscillator and configured to compensate a phase shift caused by a switching the divider.

In example 44, the subject matter of example 43 may optionally include the noise cancellation circuit comprising an integrator configured to integrate values indicative of an incremental phase shift to obtain a value indicative of an over-all phase shift.

In example 45, the subject matter of example 44 may optionally include a further digital data processing circuit to generate a sequence of values indicative of the over-all phase shift.

In example 46, the subject matter of example 45 may optionally include the further digital data processing circuit being configured to generate the sequence of vales indicative of the over-all phase shift using the same system function as the digital data processing circuit, wherein the system function is indicative of processing the plurality of digital values to obtain a processed value.

In example 47, the subject matter of any of the examples 43 to 46 may optionally include the noise cancellation circuit further comprising a multiplier configured to generate a cancellation signal based on the values indicative of the over-all phase shift, wherein the noise cancellation circuit is configured to combine the cancellation signal with the sequence of processed values.

In example 48, the subject matter of any of the examples 43 to 46 may optionally include the noise cancellation circuit being directly coupled to an output of the digital data processing circuit.

In example 49, the subject matter of any of the examples 29 to 48 may optionally include a reference signal generator configured to generate the reference signal.

In example 50, the subject matter of example 49 may optionally include the reference signal generator comprising a reference clock signal generator configured to generate a reference clock signal and a frequency multiplier circuit, the frequency multiplier circuit being configured to generate the reference signal as a frequency-multiplied signal based on the reference clock signal.

Example 51 is an integrated circuit comprising a circuit, the circuit comprising controllable oscillator configured to generate an output signal based on a control signal; an input signal processing circuit configured to receive a reference signal and to generate a sequence of digital values indicating a phase relation between the reference signal and the output signal or a signal derived from the output signal; and a digital data processing circuit configured to generate a sequence of processed values at a lower frequency than a frequency of the sequence of the digital values, wherein each processed value is based on a plurality of the digital values of the sequence of digital values, and wherein the control signal is based on the sequence of processed values.

In example 52, the subject matter of example 51 may optionally include a mixer circuit coupled to the circuit to receive the output signal of the circuit as a local oscillator signal.

In example 53, the subject matter of example 52 may optionally include the integrated circuit comprising a terminal configured to couple an antenna to the mixer circuit.

Example 54 is an integrated circuit comprising a circuit, the circuit comprising an input signal processing circuit configured to receive at least one input signal and to generate a sequence of digital values indicating time intervals concerning events comprised in the at least one input signal; and a digital data processing circuit configured to generate a sequence of processed values at a lower frequency than a frequency of the sequence of the digital values, wherein each processed value is based on a plurality of the digital values of the sequence of digital values.

Example 55 is a transmitter, a receiver or a transceiver comprising a circuit, the circuit comprising a controllable oscillator configured to generate an output signal based on a control signal; an input signal processing circuit configured to receive a reference signal and to generate a sequence of digital values indicative of a phase relation between the reference signal and the output signal or a signal derived from the output signal; and a digital data processing circuit configured to generate a sequence of processed values at a lower frequency than a frequency of the sequence of the digital values, wherein each processed value is based on a plurality of the digital values of the sequence of digital values, and wherein the control signal is based on the sequence of processed values.

In example 56, the subject matter of example 55 may optionally include a mixer circuit coupled to the circuit to receive the output signal of the circuit as a local oscillator signal.

In example 57, the subject matter of example 56 may optionally include an antenna coupled to the mixer circuit.

Example 58 is a method for generating an output signal depending on a reference signal, the method comprising generating the output signal based on a control signal; receiving the reference signal and generating a sequence of digital values indicating a phase relation between the reference signal and the output signal or a signal derived from the output signal; and generating a sequence of processed values at a lower frequency than a frequency of the sequence of the digital values, wherein each processed value is based on a plurality of the digital values of the sequence of digital values, and wherein the control signal is based on the processed values.

In example 59, the subject matter of example 58 may optionally include generating the sequence of processed values comprising digitally processing the plurality of the digital values.

In example 60, the subject matter of example 59 may optionally include digitally processing the plurality of the digital values comprising digitally filtering the digital values of the plurality of digital values.

In example 61, the subject matter of example 60 may optionally include digitally filtering the plurality of the digital values comprising digitally averaging the digital values of the plurality of digital values.

In example 62, the subject matter of example 1 may optionally include averaging the digital values of the sequence of digital values comprising arithmetically averaging the digital values based on an order of sequence of the digital values.

In example 63, the subject matter of any of the examples 56 to 62 may optionally include generating the control signal based on the processed values.

In example 64, the subject matter of any of the examples 58 to 63 may optionally include generating a feedback signal as the signal derived from the output signal, the feedback signal being the frequency divided output signal.

In example 65, the subject matter of example 64 may optionally include generating the feedback signal comprises switching between at least two different dividers such that the frequency of the output signal is divided by one of the at least two different dividers to generate the feedback signal.

In example 66, the subject matter of example 65 may optionally include compensating a phase shift caused by the switching the divider.

In example 67, the subject matter of example 66 may optionally include compensating the phase shift comprising integrating values indicative of an incremental phase shift to obtain a value indicative of an over-all phase shift.

In example 68, the subject matter of example 67 may optionally include compensating the phase shift further comprising generating a sequence of values indicative of the over-all phase shift.

In example 69, the subject matter of example 68 may optionally include generating the sequence of vales indicative of the over-all phase shift using the same system function as generating a sequence of processed values, wherein the system function is indicative of processing the plurality of digital values to obtain a processed value.

In example 70, the subject matter of any of the examples 66 to 69 may optionally include compensating a phase shift further comprising generating a cancellation signal based on the values indicative of the over-all phase shift.

In example 71, the subject matter of any of the examples 58 to 70 may optionally include generating the reference signal.

In example 72, the subject matter of example 71 may optionally include generating the reference signal comprising generating a reference clock signal and generate the reference signal as a frequency multiplied signal based on the reference clock signal.

Example 73 is a method for generating a sequence of processed values, the method comprising receiving at least one input signal; generating a sequence of digital values indicating time intervals concerning events comprised in the at least one input signal; and generating the sequence of processed values at a lower frequency than a frequency of the sequence of the digital values, wherein each processed value is based on a plurality of the digital values of the sequence of digital values.

In example 74, the subject matter of example 73 may optionally include generating the sequence of processed values comprising digitally processing the plurality of the digital values.

In example 75, the subject matter of example 74 may optionally include digitally processing the plurality of the digital values comprising digitally filtering the digital values of the plurality of digital values.

In example 76, the subject matter of example 75 may optionally include digitally filtering the plurality of the digital values comprising digitally averaging the digital values of the plurality of digital values.

In example 77, the subject matter of example 76 may optionally include averaging the digital values of the sequence of digital values comprising arithmetically averaging the digital values based on an order of sequence of the digital values.

Example 78 is a machine readable storage medium including program code, when executed, to cause a machine to perform the method of any one of claims 58 to 77.

Example 79 is machine readable storage including machine readable instructions, when executed, to implement a method or realize an apparatus as claimed in any pending claim.

Example 80 is a computer program having a program code for performing any of the methods of claims 58 to 77, when the computer program is executed on a computer or processor.

Example 81 is a means for generating a sequence of processed values, the means comprising a means for receiving at least one input signal; a means for generating a sequence of digital values indicating time intervals concerning events comprised in the at least one input signal; and a means for generating the sequence of processed values at a lower frequency than a frequency of the sequence of the digital values, wherein each processed value is based on a plurality of the digital values of the sequence of digital values.

Example 82 is a means for generating an output signal depending on a reference signal, the means comprising a means for generating the output signal based on a control signal; a means for receiving the reference signal and generating a sequence of digital values indicating a phase relation between the reference signal and the output signal or a signal derived from the output signal; and a means for generating a sequence of processed values at a lower frequency than a frequency of the sequence of the digital values, wherein each processed value is based on a plurality of the digital values of the sequence of digital values, and wherein the control signal is based on the processed values.

Examples may, therefore, provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub-acts or sub-processes may be included and be part of such a single act or process, unless explicitly excluded.

The invention claimed is:

1. A circuit comprising:
   a controllable oscillator configured to generate an output signal based on a control signal;
   an input signal processing circuit configured to receive a reference signal and generate a sequence of digital values indicating a phase relation between the reference signal and the output signal or a signal derived from the output signal;
   a digital data processing circuit configured to generate a sequence of processed values at a lower frequency than a frequency of the sequence of the digital values, wherein each processed value is based on a plurality of the digital values of the sequence of digital values,
   wherein the control signal is based on the sequence of processed values; and
   a noise cancellation circuit coupled between the input signal processing circuit and the controllable oscillator and configured to compensate a phase shift caused by a switching of the divider,
   wherein the noise cancellation circuit comprises a digital integrator configured to integrate values indicative of an incremental phase shift to obtain a value indicative of an over-all phase shift.

2. The circuit according to claim 1, wherein the digital data processing circuit is configured to generate the sequence of processed values by digitally processing the plurality of the digital values.

3. The circuit according to claim 1, further comprising a loop filter coupled between the digital data processing circuit and the controllable oscillator and configured to generate the control signal based on the processed values.

4. The circuit according to claim 1, further comprising a frequency divider coupled between the controllable oscillator and the input signal processing circuit to provide the input signal processing circuit with a feedback signal as the signal derived from the output signal, the feedback signal being the frequency divided output signal.

5. The circuit according to claim 4, wherein the frequency divider is a multi-modulus divider configured to divide the frequency of the output signal by one of at least two different dividers to provide the feedback signal in response to a divider control signal.

6. The circuit according to claim 5, further comprising a divider control circuit configured to generate the divider control signal based on a control value.

7. The circuit according to claim 6, wherein the divider control circuit is configured to generate the divider control signal such that the multi-modulus divider switches between at least two different dividers.

8. The circuit according to claim 5, wherein the divider control circuit operates at a higher operating frequency than the frequency of sequence of processed values.

9. The circuit according to claim 8, wherein the divider control circuit operates at the same operation frequency as the frequency of the sequence of digital values.

10. The circuit according to claim 5, wherein the divider control circuit comprises a sigma-delta-modulator to generate the divider control signal.

11. The circuit according to claim 10, wherein the divider control circuit further comprises a divider to divide the control value according to the ratio of the frequency of the sequence of the digital values with respect to the frequency of sequence of processed values.

12. The circuit according to claim 1, further comprising a further digital data processing circuit to generate a sequence of values indicative of the over-all phase shift.

13. The circuit according to claim 12, wherein the further digital data processing circuit is configured to generate the sequence of values indicative of the over-all phase shift using the same system function as the digital data processing circuit, wherein the system function is indicative of processing the plurality of digital values to obtain a processed value.

14. The circuit according to claim 1, wherein the noise cancellation circuit further comprises a multiplier configured to generate a cancellation signal based on the values indicative of the over-all phase shift, wherein the noise cancellation circuit is configured to combine the cancellation signal with the signal received by the noise cancellation circuit.

15. The circuit according to claim 1, wherein the noise cancellation circuit is directly coupled to an output of the digital data processing circuit.

16. The circuit according to claim 1, wherein the noise cancellation circuit is directly coupled to an input of the digital data processing circuit.

17. The circuit according to claim 1, further comprising a reference signal generator configured to generate the reference signal.

18. The circuit according to claim 17, wherein the reference signal generator comprises a reference clock signal generator configured to generate a reference clock signal and a frequency multiplier circuit, the frequency multiplier circuit being configured to generate the reference signal as a frequency multiplied signal based on the reference clock signal.

19. A time-to-digital converter comprising:
an input signal processing circuit configured to receive at least one input signal and configured to generate a sequence of digital values indicative of time intervals concerning events comprised in the at least one input signal;
a digital data processing circuit configured to generate a sequence of processed values at a lower frequency than a frequency of the sequence of the digital values, wherein each processed value is based on a plurality of the digital values of the sequence of digital values; and
a noise cancellation circuit coupled to an output of the digital data processing circuit, and configured to compensate a phase shift,
wherein the noise cancellation circuit comprises a digital integrator configured to integrate values indicative of an incremental phase shift to obtain a value indicative of an over-all phase shift.

20. An integrated circuit comprising a circuit, the circuit comprising:
a controllable oscillator configured to generate an output signal based on a control signal;
an input signal processing circuit configured to receive a reference signal and to generate a sequence of digital values indicating a phase relation between the reference signal and the output signal or a signal derived from the output signal;
a digital data processing circuit configured to generate a sequence of processed values at a lower frequency than a frequency of the sequence of the digital values, wherein each processed value is based on a plurality of the digital values of the sequence of digital values,
wherein the control signal is based on the sequence of processed values; and
a noise cancellation circuit coupled between the input signal processing circuit and the controllable oscillator and configured to compensate a phase shift caused by a switching of the divider,
wherein the noise cancellation circuit comprises a digital integrator configured to integrate values indicative of an incremental phase shift to obtain a value indicative of an over-all phase shift.

21. A method for generating an output signal depending on a reference signal, the method comprising:
generating the output signal based on a control signal;
receiving the reference signal and generating a sequence of digital values indicating a phase relation between the reference signal and the output signal or a signal derived from the output signal; and
generating a sequence of processed values at a lower frequency than a frequency of the sequence of the digital values, wherein each processed value being is on a plurality of the digital values of the sequence of digital values, and wherein the control signal is based on the processed values; and
performing a noise cancellation by digitally integrating the sequence of digital values or the sequence of processed values.

* * * * *